(12) United States Patent
Rainer et al.

(10) Patent No.: US 10,135,345 B2
(45) Date of Patent: Nov. 20, 2018

(54) CURRENT SENSING IN AN ELECTROMAGNETIC COMPONENT USING AN AUXILIARY WINDING STUB

(71) Applicant: Infineon Technologies Austria AG, Villach (AT)

(72) Inventors: Christian Rainer, Klagenfurt (AT); Chris Notsch, Villach (AT)

(73) Assignee: Infineon Technologies Austria AG, Villach (AT)

( * ) Notice: Subject to any disclaimer, the term of this patent is extended or adjusted under 35 U.S.C. 154(b) by 14 days.

(21) Appl. No.: 15/252,643

(22) Filed: Aug. 31, 2016

(65) Prior Publication Data

US 2018/0062523 A1    Mar. 1, 2018

(51) Int. Cl.
| | | |
|---|---|---|
| *H02M 3/335* | (2006.01) | |
| *G01R 19/00* | (2006.01) | |
| *G01R 15/18* | (2006.01) | |
| *H02M 1/08* | (2006.01) | |
| *G01R 31/34* | (2006.01) | |
| *H02M 1/00* | (2006.01) | |

(52) U.S. Cl.
CPC ...... *H02M 3/33507* (2013.01); *G01R 15/185* (2013.01); *G01R 19/0092* (2013.01); *H02M 1/08* (2013.01); *G01R 31/343* (2013.01); *H02M 2001/0009* (2013.01); *H05K 999/99* (2013.01)

(58) Field of Classification Search
CPC ........................ H02M 1/08; H02M 2001/0009
See application file for complete search history.

(56) References Cited

U.S. PATENT DOCUMENTS

| | | | | |
|---|---|---|---|---|
| 6,486,642 B1* | 11/2002 | Qian | ..................... | H02M 3/158 323/255 |
| 6,674,278 B1* | 1/2004 | Uesugi | .................. | G01R 15/18 324/117 R |
| 9,837,907 B1* | 12/2017 | Babazadeh | ......... | H02M 3/1588 |

(Continued)

OTHER PUBLICATIONS

Babazadeh, Amir et al., "Current Sensing and Zero-Cross Detection in Semi-Resonant Voltage Converters", U.S. Appl. No. 15/213,810, filed Jul. 19, 2016, pp. 1-44.

*Primary Examiner* — Yusef A Ahmed
(74) *Attorney, Agent, or Firm* — Murphy, Bilak & Homiller, PLLC (57) ABSTRACT

Many electronic devices, such as voltage converters, motors, etc., include electromagnetic components through which the current flow must be estimated. Such electromagnetic components include transformer windings, motor windings, and other types of inductors. In order to estimate the current through such components with reasonable accuracy and without unnecessary power loss, the inherent resistance of the electromagnetic component is used in conjunction with an auxiliary winding through which effectively no current flows. A first terminal of the auxiliary winding directly connects to a first terminal of the electromagnetic component and runs in parallel to the component. The voltage across a second terminal of the auxiliary winding and a second terminal of the electromagnetic component is measured and closely approximates the voltage across the equivalent series resistance (ESR) of the electromagnetic component. This measured voltage is used to estimate the current through the component.

18 Claims, 8 Drawing Sheets

(56) References Cited

U.S. PATENT DOCUMENTS

| | | | | |
|---|---|---|---|---|
| 2005/0286272 | A1* | 12/2005 | Iwamoto | H02M 1/34 363/21.01 |
| 2006/0139967 | A1* | 6/2006 | Quitayen | H02M 3/33592 363/21.06 |
| 2007/0247084 | A1* | 10/2007 | Zhao | H05B 39/045 315/291 |
| 2008/0007977 | A1* | 1/2008 | Piper | H02M 3/33523 363/21.16 |
| 2008/0055944 | A1* | 3/2008 | Wang | H02M 3/33592 363/21.06 |
| 2009/0146643 | A1* | 6/2009 | Ostrom | H02M 3/156 324/123 R |
| 2010/0109648 | A1* | 5/2010 | Cheung | G01R 15/181 324/126 |
| 2010/0237843 | A1* | 9/2010 | Rivet | H02M 1/16 323/282 |
| 2012/0218793 | A1* | 8/2012 | Springett | H02M 3/33592 363/89 |
| 2015/0115911 | A1* | 4/2015 | Parto | H02M 3/158 323/271 |
| 2015/0249391 | A1* | 9/2015 | Yang | H02M 3/33576 363/21.01 |
| 2015/0268280 | A1* | 9/2015 | Miljanic | G01R 15/185 324/127 |
| 2016/0072392 | A1* | 3/2016 | Soares | H02M 3/33569 363/21.02 |
| 2017/0307662 | A1* | 10/2017 | Miljanic | G01R 15/185 |
| 2017/0317595 | A1* | 11/2017 | Babazadeh | H02M 1/08 |
| 2017/0331386 | A1* | 11/2017 | Babazadeh | H02M 1/08 |

* cited by examiner

CURRENT SENSING IN AN ELECTROMAGNETIC COMPONENT USING AN AUXILIARY WINDING STUB

TECHNICAL FIELD

The present application relates to electromagnetic components such as transformers, inductors and motor windings, and, in particular, relates to techniques for estimating the current in such components by using an auxiliary winding through which no significant current flows.

BACKGROUND

Electromagnetic components are electrical components that make use of the magnetic fields associated with electrical current passing through such components. Examples of electromagnetic components include inductors, transformers, and motor windings. Electromagnetic components are used in a variety of electrical devices, and it is often necessary to estimate the electrical current flowing through such components. For example, the current through a transformer winding of a switched-mode power supply (SMPS) must often be estimated, the current through a winding within an electric motor may need to be estimated, or it may be necessary to estimate the current through an inductor in some other type of electrical circuit.

In an SMPS configured in an isolated topology, the current through transformer windings must often be estimated to ensure that the transformer core does not reach a saturation level of magnetic flux, and for purposes of controlling the output power provided to a load. In a resonant or semi-resonant SMPS, it is desirable that power switches only be disabled when there is no (or almost no) current flowing through them. This requires that the current flowing through a power switch be estimated. Because this current also flows through the winding(s) of a transformer (or center-tapped inductor), this current may be estimated based upon the current through such winding(s).

Many techniques for estimating current flowing through electromagnetic components are available, including techniques that make use of shunt resistors, direct current resistance (DCR) circuits, Hall effect sensors, current transformers, and power switches. As summarized below, such conventional current sensing techniques have drawbacks in many applications.

Perhaps the most straightforward technique for measuring current through a component, electromagnetic or otherwise, is to place a shunt resistor in series with the component. The voltage across the shunt resistor is measured and the current is calculated using Ohm's law. While such techniques are simple, the shunt resistor wastes power due to the $I^2R$ losses through it, and the shunt resistor undesirably increases the effective resistance of the component. In order to minimize these effects, a shunt resistor having a very low resistance is often used, and an amplifier is used to amplify the voltage across the shunt resistor so that the voltage is in a usable range for, e.g., an analog-to-digital converter (ADC). This can result in a noisy measured voltage and a non-trivial temperature dependence for the resistance, both of which lead to inaccurate results.

A direct current resistance (DCR) sense circuit addresses some of the deficiencies associated with use of a shunt resistor. A DCR circuit makes use of the inherent resistance of an inductor (or, similarly, a winding of a transformer), together with a matching circuit, including, typically, a capacitor and a sense resistor. The capacitor(s) and sense resistor(s) are chosen such that a voltage output from the DCR circuit may be used to estimate the current through an inductor (or transformer winding). While such techniques avoid the power loss associated with a shunt resistor, these techniques present a variety of accuracy issues. The capacitor(s) within the DCR sense circuit typically have large tolerance values, meaning that the circuit must often be painstakingly tuned. Because the capacitance and inductance within the DCR sense circuit may have significant (and different) temperature dependencies, the current estimates often exhibit significant temperature-dependent errors. Furthermore, a DCR sense circuit produces results that are highly frequency-dependent, due to the matching capacitor(s) and the inductance of the electromagnetic component (e.g., inductor or transformer winding).

A Hall effect sensor measures the strength of the magnetic field induced by current flow through a nearby conductor in order to determine the current passing through that conductor. Hall effect sensors are typically bandwidth-limited (e.g., they can only be used to measure signals <150 kHz) and, hence, are not appropriate for applications using relatively high frequency signals (e.g., many SMPS). The current estimates produced by Hall effect sensors exhibit inaccuracies due to a variety of reasons. For example, physical inaccuracies and material non-uniformities in a sensor may lead to an offset in the output voltage used for indicating the sensed current. Additionally, the estimates provided by a Hall effect sensor drift as temperature changes, and are subject to inaccuracies caused by external magnetic fields that interfere with the field from the intended electromagnetic component (e.g., inductor). Furthermore, Hall effect sensors are expensive and consume potentially valuable area on a printed circuit board (PCB), or similar, within an electrical device.

Yet another technique for measuring current is to add a current transformer in series with the electromagnetic component. Such a transformer couples a magnetic field that is proportional to a primary current into a secondary winding. A burden resistor is coupled across the secondary winding so that the secondary current may be converted into a voltage that may be measured and translated into a current estimate. The secondary winding, and its associated burden resistor, typically have a current that is much lower than that flowing through the primary winding (and the electromagnetic component), and a voltage that is much higher than (the undesired) voltage generated across the primary winding. Use of a current transformer has the disadvantages that it requires an alternating current (AC), it produces AC insertion loss, it has a fairly large size, and it is expensive.

For electrical devices that include electromagnetic components through which current also flows through a power switch such as a metal-oxide semiconductor field-effect transistor (MOSFET), the MOSFET current may be estimated. One technique for doing so makes use of a drain-to-source voltage measurement and a characteristic drain-source resistance ($R_{dson}$) when the MOSFET is enabled and conducting. While such techniques do not incur additional unnecessary power loss, as do many of the above techniques, current estimates based upon of $R_{dson}$ exhibit significant noise, have a high temperature dependency, and produce larger errors due to production variations for the MOSFET(s). Because the MOSFET must be enabled to obtain a meaningful drain-to-source voltage, such techniques are only able to estimate current when the MOSFET is conducting.

Yet another technique uses a sensing transistor (current mirror) to sense the current through a power switch (e.g., MOSFET). Such techniques make use of a sensing transistor (e.g., MOSFET) that is configured in parallel with a power switch, and through which a current proportional to that in the power switch flows. Such techniques exhibit high noise, require a high design effort, and current measurements are only possible during the "on" time of the power switch.

Accordingly, there is a need for improved techniques for estimating current through an electromagnetic component, and which mitigate at least some of the problems described above for conventional current estimation techniques. Such improved techniques should not incur any significant power loss, should require minimal extra circuitry, and should provide accurate current estimates.

SUMMARY

According to an embodiment of a current sense circuit configured to estimate the current through a main winding, the current sense circuit includes the main winding, an auxiliary winding, and a current estimator. The main winding is characterized by an inductance and an equivalent series resistance (ESR), and is directly connected to the auxiliary winding at a common terminal. The auxiliary winding is configured to compensate for the inductance of the main winding. The main and auxiliary windings each have an output terminal, and the output terminals are coupled to inputs of the current estimator. The current estimator is operable to measure a voltage between the output terminals of the main and auxiliary windings, and to estimate the current in the main winding based upon this voltage and the ESR of the main winding. The inputs of the current estimator present high impedances to the main and auxiliary output terminals, such that substantially no current flows through the auxiliary winding. Hence, the measured voltage is proportional to the current flowing through the main winding.

According to a method, the current in a main winding is estimated. The main winding includes a common terminal and a main output terminal. An auxiliary winding is provided such that it connects directly to the common terminal, and is configured to compensate for the inductance of the main winding. The auxiliary winding has an auxiliary output terminal. The voltage between the main and auxiliary output terminals is measured using a high-impedance sensing circuit, wherein the sensing circuit presents a high impedance to the auxiliary output terminal such that approximately no current flows through the auxiliary winding. The measured voltage is proportional to the current flowing through the main winding, and this current is estimated based upon the measured voltage and an equivalent series resistance (ESR) of the main winding.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description that follows.

DETAILED DESCRIPTION

The embodiments described herein provide techniques for estimating current flowing through an electromagnetic component such as a transformer winding, a motor winding, or some other type of inductor. These techniques make use of the inherent resistance through such an electromagnetic component, in conjunction with an auxiliary winding through which substantially no current flows. The auxiliary winding compensates for the inductance of the electromagnetic component, henceforth often termed a main winding, such that a voltage approximating the voltage across the inherent resistance may be measured. Because these techniques use the inherent (or parasitic) resistance of the main winding, they do not waste power as do techniques relying upon a shunt resistor. Because the auxiliary and main windings have similar inductances, they have similar temperature dependencies such that the auxiliary winding intrinsically maintains its compensatory relationship to the main winding across temperature. For example, when the inductance of the main winding increases due to a temperature change, the inductance of the auxiliary winding will similarly increase. This presents an advantage over direct current resistance (DCR) sensing techniques, wherein the capacitance of a matching circuit may exhibit a temperature dependence significantly different from that of the winding inductance through which current is being estimated.

Various embodiments of current sense circuits, electronic devices, and methods for estimating current are provided in the following detailed description and the associated figures. The described embodiments provide particular examples for purposes of explanation, and are not meant to be limiting. Features and aspects from the example embodiments may be combined or re-arranged, except where the context does not allow this.

In the first embodiment described below, a current sense circuit is used to estimate the current flowing through a main winding. This description is followed by descriptions of switched-mode power supplies (SMPS) that include such main windings, and it is explained how the current sense circuit may be used to estimate the current through these main windings. More particularly, such current estimation techniques are shown within a resonant (Cuk) voltage converter, an isolated voltage converter using a flyback transformer, and a buck voltage converter. Additionally, it is shown how the current sense circuit may be incorporated within an electric motor to estimate the current through its windings.

Subsequent to describing the current sense circuit and devices in which it may be used, potential problems (inaccuracies) with the described current estimation techniques are described. Such potential problems are due to, e.g., a mismatch between the number of turns (and associated inductance) of the main vs. the auxiliary windings, and to leakage inductance within a transformer. Circuitry and related techniques for compensating for such problems are described.

In addition to the current sense circuit embodiment and associated device embodiments, an embodiment of a method for estimating the current in a main winding is described.

Figure 1:
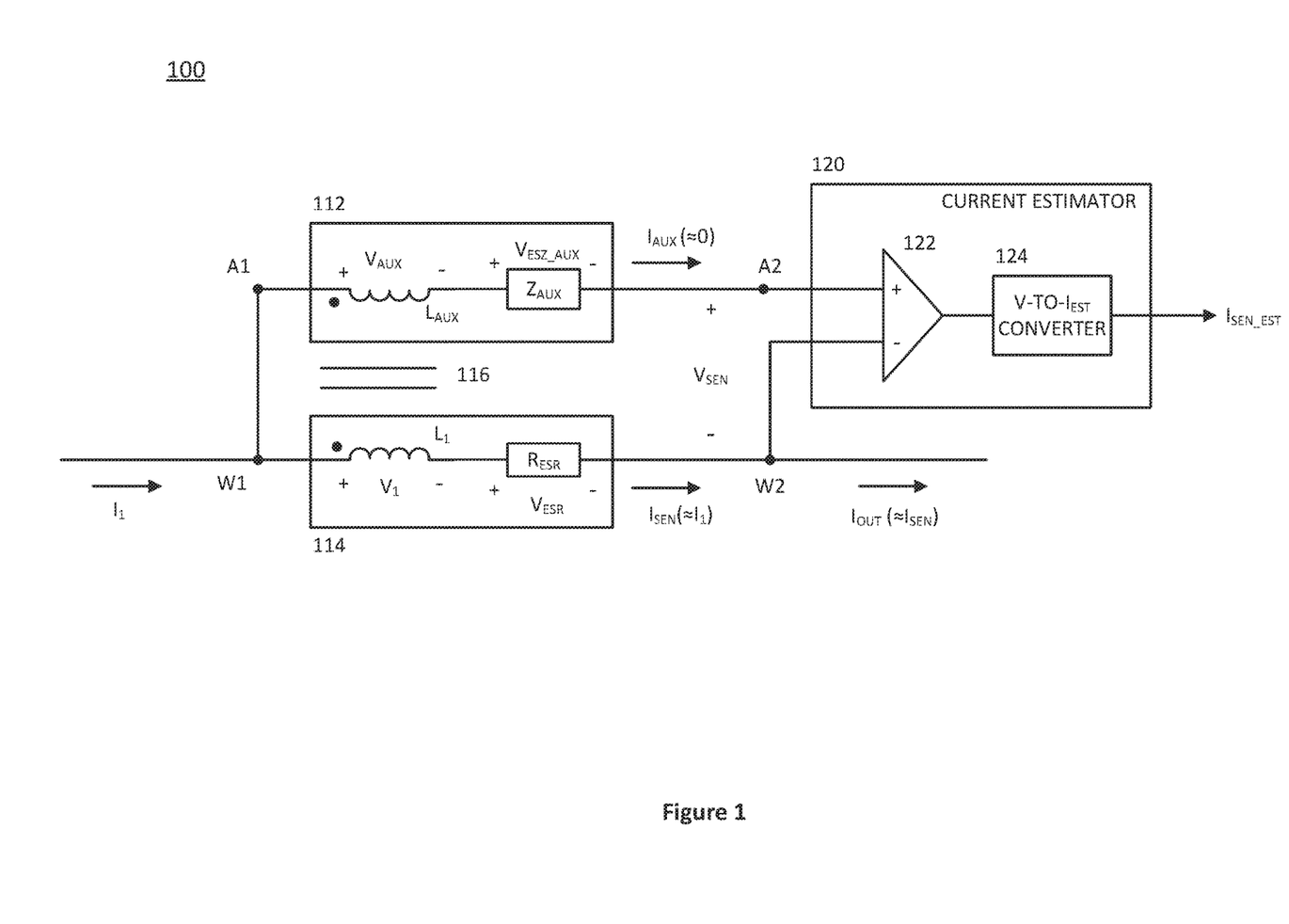
FIG. 1 illustrates a current sense circuit that includes an auxiliary winding and a current estimator configured to estimate the current through a main winding.

FIG. 1 illustrates a current sense circuit 100 including a main winding 114 having a current $I_1$ that is to be estimated. The main winding 114 is modeled as an ideal inductive component $L_1$ and a resistor $R_{ESR}$, which represents the equivalent series resistance (ESR) of the main winding 114. The main winding 114 has an input terminal W1 and an output terminal W2. The current sense circuit 100 also includes an auxiliary winding 112 and a current estimator 120.

The auxiliary winding 112 is modeled as having an inductance $L_{AUX}$ and an impedance $Z_{AUX}$. The auxiliary winding 112 has an input terminal A1 and an output terminal A2. The input terminal A1 is directly coupled to the input terminal W1 and, thus, these terminals A1, W1 may be considered to be a single common terminal and voltage node. The auxiliary winding 112 is magnetically coupled to the main winding 114 via a core 116. In many applications, including most transformers, the core 116 is made of a magnetic material having a high permeability such as iron, laminated steel, or powdered iron. In other applications, an air or other non-magnetic core material may be used. Due to the favorable mutual inductance properties of a high-permeability core, it is preferred that the core 116 be constructed of a high-permeability material.

The auxiliary winding 112 is designed such that it compensates for the voltage $V_1$ across the inductive component $L_1$ of the main winding 114, but leaves the voltage $V_{ESR}$ across the resistive component, as modeled by $R_{ESR}$, uncompensated. This may be accomplished using, e.g., a bifilar construction for the windings 112, 114 such that the mutual inductance between the auxiliary and main windings 112, 114 generates a voltage $V_{AUX}$ across the inductance $L_{AUX}$ that is equal to (or very closely equal to) the voltage $V_1$ across the inductive component $L_1$ of the main winding 114, i.e., $V_{AUX} \approx V_1$. For auxiliary and main windings 112, 114 that are tightly magnetically coupled around a common core, this may be accomplished, e.g., by constructing the auxiliary winding 112 to have a similar length and number of turns as the main winding 114. The impedance $Z_{AUX}$ of the auxiliary winding 112, which is dominated by its resistive component (the ESR of the auxiliary winding), may be quite large and, notably, considerably larger than the resistance $R_{ESR}$ of the main winding.

The current estimator 120 is coupled to the output terminals A2, W2 of the auxiliary and main windings 112, 114, so that it can read the voltage $V_{SEN}$ across these terminals. The current estimator 120 presents a high input impedance at its inputs, such that no (or almost no) current flows into the current estimator 120 at either of these inputs.

The combination of the high input impedance of the current estimator 120, e.g., as seen at terminal A2, and the relatively large impedance $Z_{AUX}$ of the auxiliary winding 112, means that the auxiliary winding 112 presents a high impedance to the rest of the circuit and, more particularly, the input impedance to the auxiliary winding 112 is much greater than the input impedance to the main winding 114. In a preferred embodiment, the input impedance presented by the current estimator 120, with or without the additional impedance $Z_{AUX}$ of the auxiliary winding 112, should be one, two, or more order(s) of magnitude greater than the resistance $R_{ESR}$ of the main winding 114. Hence, no (or substantially no) current flows through the auxiliary winding 112, i.e., $I_{AUX} \approx 0$. For example, the current $I_{AUX}$ in the auxiliary winding 112 may be one, two, or more order(s) of magnitude lower than the current $I_{SEN}$ in the main winding 114. With substantially no current flow through the auxiliary winding 112, the voltage drop across its impedance $Z_{AUX}$ is small enough that this voltage may be ignored in the current estimation, i.e., $V_{ESZ\_AUX} \approx 0$. Considering that $V_{AUX} \approx V_1$, as explained above, the sense voltage $V_{SEN}$ closely approximates the voltage $V_{ESR}$ across the resistance $R_{ESR}$ of the main winding 114. The current $I_{SEN}$ through the main winding 114 can therefore be determined using:

$$I_{SEN} = \frac{V_{ESR}}{R_{ESR}} \approx \frac{V_{SEN}}{R_{ESR}}. \tag{1}$$

Note that the sense voltage $V_{SEN}$ is proportional, i.e., linearly related with no constant bias, to the current $I_{SEN}$ flowing through the main winding 114. (As will be described below, practical considerations may lead to nonlinearities which may need to be compensated for using circuitry and/or the current estimator 120.) The resistance $R_{ESR}$ may be determined (measured) during a calibration or configuration phase of the current sense circuit 100, using conventional techniques. The resistance $R_{ESR}$ may also be temperature compensated using conventional techniques. Because techniques for determining and temperature compensating an equivalent series resistance (ESR) are well-known in the art, they will not be further described herein, in order to avoid obscuring the unique aspects of the invention.

Regarding temperature variation, it should be appreciated that the techniques used by the current sensing circuit 100 are considerably less temperature dependent than other current sensing techniques, and more consistent results may be obtained because of this. For example, a DCR-based current-sensing circuit often includes a capacitor, the winding (inductor) through which current is being estimated, and resistances. Each of these components have different temperature characteristics, making temperature compensation difficult or even unfeasible. Within the current sense circuit 100, the inductance $L_1$ of the main winding 114 may have a moderate temperature dependence. However, the inductance $L_{AUX}$ of the auxiliary winding 112 should be designed to have a similar temperature dependence, such that the relationship $V_1 \approx V_{AUX}$ is maintained across the usable temperature range. Hence, only the equivalent series resistance $R_{ESR}$ potentially needs temperature compensating, which is more easily and consistently achievable than temperature compensation in other current-sensing circuits such as those based upon DCR, transistor impedance, or transistor current mirrors.

The current estimator 120 inputs the sense voltage $V_{SEN}$ and converts it into a current estimate $I_{SEN\_EST}$. The current estimator 120 of FIG. 1 includes a differential amplifier 122, as may be constructed from an operational amplifier, and a voltage-to-current estimate converter 124. Note that there are numerous ways in which a current estimator may be implemented, and FIG. 1 illustrates but one of these. For example, the current estimator 120 could be implemented using entirely analog circuitry, in which case the voltage-to-current-estimate converter 124 would merely scale the output of the differential amplifier 122 and provide the current estimate $I_{SEN\_EST}$ as an analog voltage signal. In the preferred implementation described below, the current estimator 120 includes a mixture of analog and digital circuitry, and the current estimator 120 outputs the current estimate $I_{SEN\_EST}$ using a digital representation.

The main winding 114 is typically designed with a goal of minimizing its equivalent series resistance $R_{ESR}$, in order to minimize the impedance presented by the main winding 114 and in order to minimize $I^2R$ power loss through the main winding 114. With a small resistance $R_{ESR}$, the voltage $V_{ESR}$ across this resistance $R_{ESR}$ will be small and susceptible to noise, as will the corresponding sense voltage $V_{SEN}$. In order to mitigate noise and translate the sense voltage $V_{SEN}$ into a usable range, the differential amplifier 122 amplifies the sense voltage and provides an amplified voltage to the voltage-to-current-estimate converter 124.

The voltage-to-current-estimate converter 124 of FIG. 1 includes an analog-to-digital converter (ADC), which is not shown for ease of illustration. The ADC inputs the amplified voltage, digitizes it, and outputs a digital representation. The voltage-to-current-estimate converter 124 uses this digital representation to generate the current estimate $I_{SEN\_EST}$ using, e.g., the relationship shown in equation (1). A value for the equivalent series resistance $R_{ESR}$ is stored in a memory (not shown for ease of illustration) of the voltage-to-current-estimate converter 124, so that it may be used in the generation of the current estimate $I_{SEN\_EST}$. As an alternative to use of $R_{ESR}$ or in conjunction with its use, a table lookup may be used for translating the digital representation of the amplified voltage into the current estimate $I_{SEN\_EST}$. Note, also, that the voltage-to-current-estimate converter 124 may compensate for temperature variation, e.g., by using a temperature estimate and a temperature-compensation table to alter the $R_{ESR}$ value before it is used for generating the current estimate $I_{SEN\_EST}$, or by otherwise modifying the current estimate $I_{SEN\_EST}$ before it is output from the current estimator 120.

As explained above, the current estimator 120 and its constituent parts may be implemented using a combination of analog hardware components (such as transistors, amplifiers, diodes, and resistors), and processor circuitry that includes primarily digital components. The processor circuitry may include one or more of a digital signal processor (DSP), a general-purpose processor, and an application-specific integrated circuit (ASIC). The current estimator 120 may also include memory, e.g., non-volatile memory such as flash, that includes instructions or data (e.g., tables, $R_{ESR}$ value) for use by the processor circuitry.

Figure 2:
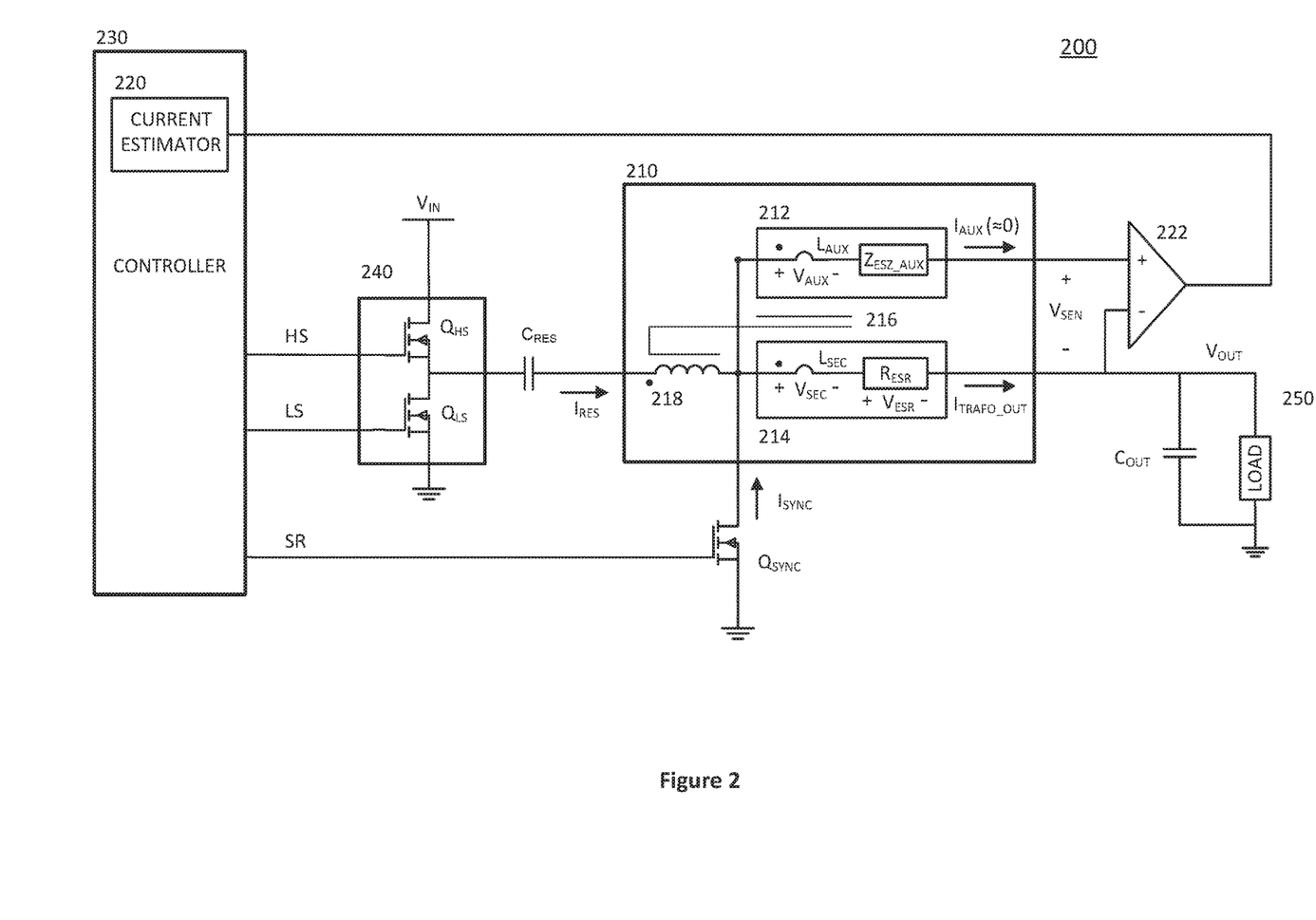
FIG. 2 illustrates a circuit diagram for a resonant switched mode power supply (SMPS) that makes use of the current sense circuit of FIG. 1, in order to estimate the current in a transformer winding of the SMPS.
Figure 3:
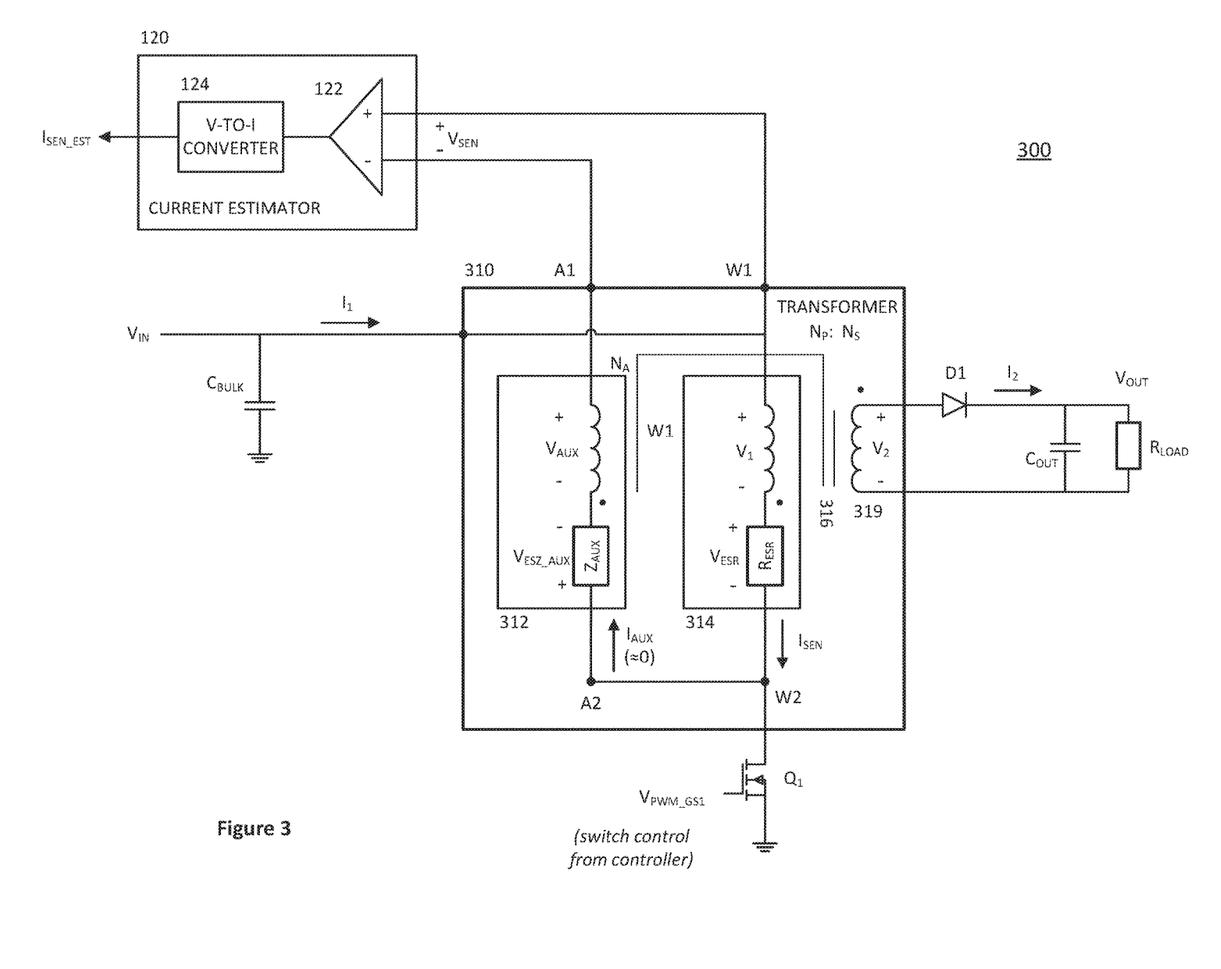
FIG. 3 illustrates a circuit diagram for a flyback converter that makes use of the current sense circuit of FIG. 1, in order to estimate the current through a transformer winding.
Figure 4:
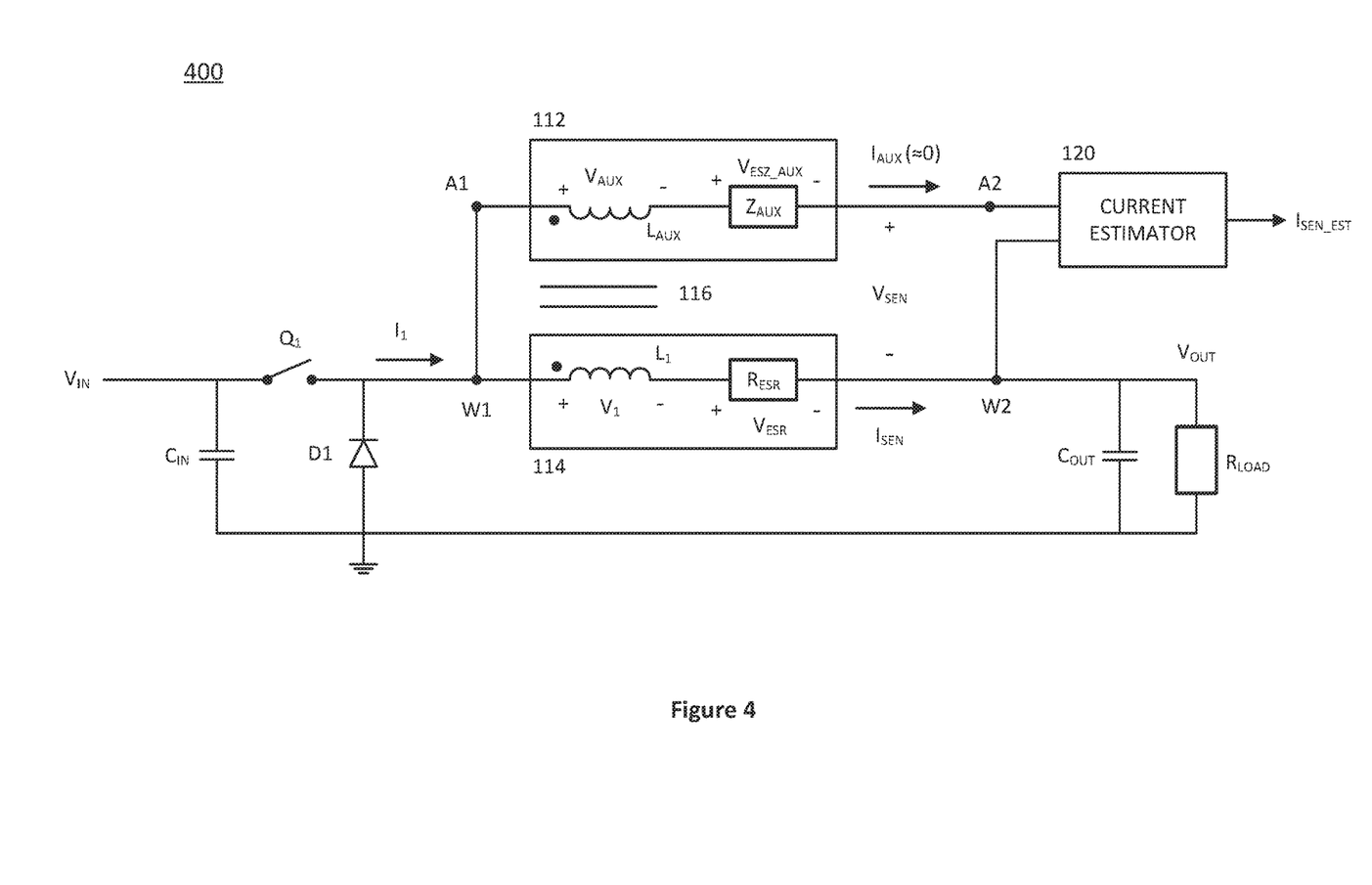
FIG. 4 illustrates a circuit diagram of a buck converter that makes use of the current sense circuit of FIG. 1, in order to estimate the current through an inductor of the buck converter.
Figure 5:
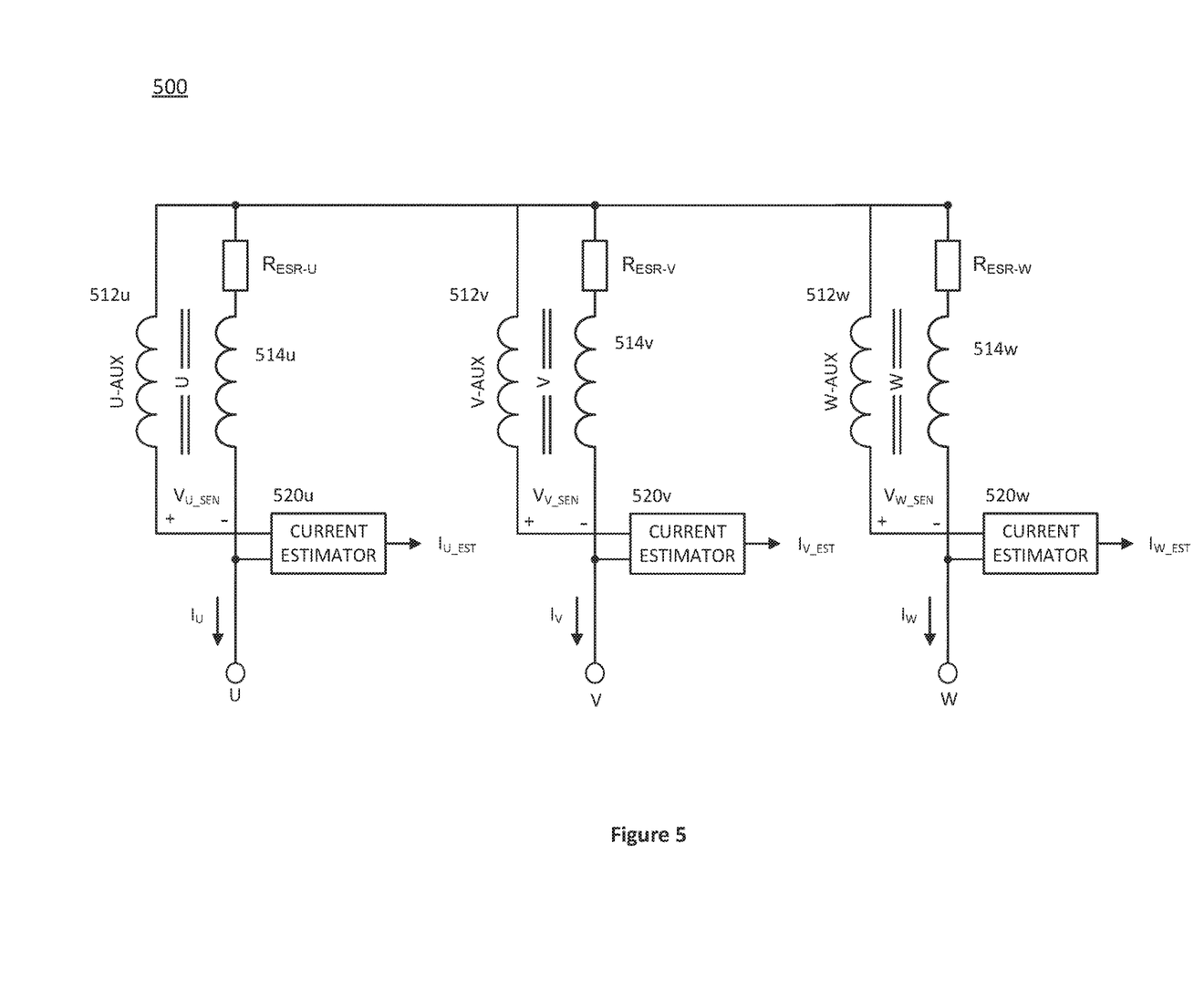
FIG. 5 illustrates a circuit diagram for a three-phase electric motor, wherein the current sense circuit of FIG. 1 is used to estimate the current within the windings of the motor.

FIG. 1 and the above description explain how an auxiliary winding and a current estimator may be used to estimate the current $I_{SEN}$ through a main winding such as an inductor. A current sense circuit, such as that of FIG. 1, may be used in a variety of applications and electrical devices. Below, several such electrical devices are described, in order to explain how the current sense circuit 100 of FIG. 1, or a variation thereof, may be advantageously incorporated into such electrical devices. FIGS. 2-4 illustrate switched mode power supplies (SMPS), also termed DC-DC voltage converters, in which current sense circuits are used for estimating current. FIG. 5 illustrates an exemplary motor in which current is estimated. The current sense circuits within the electrical devices of FIGS. 2-5 are similar to the current sense circuit 100 of FIG. 1, and comprehensive descriptions of these circuits are not repeated below. For detailed circuit descriptions not provided below, refer to the similar circuitry described above in conjunction with FIG. 1.

FIG. 2 illustrates an SMPS circuit 200 configured in a non-isolated resonant (Cuk) topology that makes use of a center-tapped inductor/transformer 210. Such resonant and semi-resonant SMPS are gaining in popularity due to their high efficiency, limited component requirements, and low noise. The current through the transformer 210 of such an SMPS must often be estimated for several reasons. First, a controller 230 may need an estimate of the output current $I_{TRAFO\_OUT}$ in order to control the SMPS circuit 200 to provide adequate power for a load 250 of the SMPS, for sensing the current flow into an output capacitor $C_{OUT}$, and, potentially, for coordinating the power output for different phases of a multi-phase SMPS. (For ease of illustration and because multi-phase SMPS are well-known in the art, only a single phase SMPS is shown in FIG. 2.) Second, the synchronous switch $Q_{SYNC}$ should be switched (e.g., disabled) when the current $I_{SYNC}$ through it is zero (or as near to zero as possible), in order to achieve "zero current switching" (ZCS). While the techniques described do not show direct estimation of the synchronous current $I_{SYNC}$, this current may be determined from the resonant current $I_{RES}$ and the output current $I_{TRAFO\_OUT}$, each of which can be estimated using an auxiliary winding. Alternatively, the synchronous current $I_{SYNC}$ may be determined only from the output current $I_{TRAFO\_OUT}$. For example, in a step-down SMPS in which $I_{RES} \ll I_{TRAFO\_OUT}$, the resonant current $I_{RES}$ may be neglected leading to the estimation $I_{SYNC} \approx I_{TRAFO\_OUT}$. Regardless of the manner in which the estimated current is used, the techniques for estimating the current through a winding, as described herein, may be applied.

The SMPS circuit 200 includes a controller 230, a power stage 240, a center-tapped inductor/transformer 210, a differential amplifier 222, and a synchronization switch $Q_{SYNC}$. The SMPS circuit 200 inputs power from a source voltage $V_{IN}$ and supplies power to a load 250 (and an associated filter capacitor $C_{OUT}$) of the SMPS at an output node $V_{OUT}$. Because the operation of resonant SMPS circuits is well-known in the art, many details regarding the conventional operation (e.g., switching frequency control) of a resonant SMPS will not be further described, in order to provide focus on the unique techniques related to current estimation.

The power stage 240 inputs the source voltage $V_{IN}$ and supplies power to a resonant capacitor $C_{RES}$. The power stage 240 includes a high-side power switch $Q_{HS}$ and a low-side power switch $Q_{LS}$, which provide an alternating voltage waveform to the resonant capacitor $C_{RES}$, and the transformer 210 coupled thereto. The switches are controlled by PWM waveforms HS, LS provided by the controller 230. The frequency and duty cycle of these PWM waveforms HS, LS determine how much power is provided to the transformer 210 and, ultimately, to the load 250. The controller 230 typically monitors the output voltage $V_{OUT}$ and current $I_{TRAFO\_OUT}$ in order to generate these waveforms HS, LS, and ensure that the load 250 receives adequate power. Additionally, the controller 230 provides a PWM waveform SR to the synchronization switch $Q_{SYNC}$. The current $I_{SYNC}$ through the synchronization switch $Q_{SYNC}$ must be known by the controller 230 so that the controller 230 may disable the synchronization switch $Q_{SYNC}$ at an optimal point within each switch cycle, i.e., when the current $I_{SYNC}$ is zero. Note that in some implementations, a diode may be used rather than a synchronization switch. Such diode-based implementations are, generally, not preferred due to the additional power loss across a diode as compared with a synchronization switch. (Diode-based implementations are not illustrated herein.)

The transformer 210 has a primary winding 218 and a secondary winding 214, and is configured as a center-tapped inductor, i.e., one terminal of the primary winding 218 is tied to a terminal of the secondary winding 214. The primary winding 218 has N=12 turns and the secondary winding has a single turn, so that (at least ideally) the voltage is stepped down by 12:1 and the current is stepped up by 12:1, i.e., $I_{TRAFO\_OUT} \approx 12 * I_{RES}$. Note that transformers/center-tapped inductors within resonant converters, such as the SMPS circuit 200, often have only a single turn in their secondary winding, so as to reduce the impedance of this winding and, related, minimize $I^2R$ power loss caused by the ESR of the winding. A magnetic core 216 inductively couples the primary and secondary windings 218, 214.

The transformer/center-tapped inductor 210 further includes an auxiliary winding 212, which is magnetically coupled to the secondary winding 214 by the magnetic core 216. As similarly described for the auxiliary winding 112 within the current sense circuit 100 of FIG. 1, the auxiliary winding 212 is configured such that its inductance $L_{AUX}$ produces a voltage $V_{AUX}$ in the auxiliary winding that compensates for the voltage $V_{SEC}$ across the inductive component $L_{SEC}$ of the secondary winding 214. Given this relation, the sense voltage $V_{SEN}$ generated across outputs for the auxiliary and main windings 212, 214 approximates the voltage $V_{ESR}$ across the resistance $R_{ESR}$ of the main winding 214, i.e., $V_{SEN} \approx V_{ESR}$.

As shown in FIG. 2, the auxiliary and secondary windings 212, 214 are directly connected at a common terminal that is also the center tap of the transformer/center-tapped inductor 210. It should be appreciated that the common terminal could be located at the other side of the main winding 214, i.e., at the output node $V_{OUT}$. For such a configuration, the main winding terminal corresponding to the center tap is input to the differential amplifier 222. Note that this is not a preferred configuration, as the center tap of the transformer/center-tapped inductor 210 tends to be fairly noisy as compared to the output node $V_{OUT}$. Hence, the illustrated configuration of terminal connections is preferred.

The transformer 210 may have a planar design. For such a design, each of one or more turns of the secondary winding 214 is provided in one or more layers (planes) of the transformer 210. Within each layer having a secondary winding turn, an auxiliary winding turn is also provided. For example, the auxiliary winding turn may be provided on the outside of the secondary winding turn, or on the inside of the secondary winding turn. Because the impedance of the auxiliary winding 112 is not critical (as is the ESR of the secondary winding 214), the width of an auxiliary winding turn may be considerably smaller than that of the corresponding secondary winding turn. It is important that the auxiliary and secondary windings 212, 214 have a similar number of turns and similar lengths.

The sense voltage $V_{SEN}$ may then be used to estimate the current $I_{TRAFO\_OUT}$, in the same manner as described in the current sense circuit 100. Unlike in the current sense circuit 100 of FIG. 1, the differential amplifier 222 of the SMPS circuit 200 is illustrated as being outside of the current estimator 220, but it provides the same functionality. Furthermore, the current estimator 220, which may include a voltage-to-current-estimate converter, ADC, etc., is illustrated as being part of the SMPS controller 230. The SMPS controller 230 typically includes ADCs for other purposes, e.g., sensing the output voltage $V_{OUT}$, as well as a processor and memory that are used for control of the SMPS 200. Such circuits may be re-used and/or augmented to also implement the current estimator 220.

FIG. 3 illustrates an isolated SMPS circuit 300 configured as a flyback voltage converter. This SMPS circuit 300 is supplied power from a source $V_{IN}$, and provides power to a load $R_{LOAD}$. A transformer 310 has a primary winding 314 and a secondary winding 319, and may be used to step the input voltage $V_{IN}$ up or down, as determined by the turns ratio $N_P:N_S$. An alternating voltage $V_2$ is induced on the secondary winding 319, and is rectified by a diode D1 to produce a current $I_2$ that supplies the load $R_{LOAD}$. As an alternative to the diode D1, a power switch, e.g., a MOSFET, could be used to implement active rectification, which may have power advantages in many applications. Such active rectification is a well-known alternative to diode-based rectification, and, for ease of illustration, is not shown in the figure. The amount of power supplied to the load $R_{LOAD}$ is controlled by switching the current flow through the primary winding 314, by using a power switch $Q_1$. The power switch $Q_1$ is controlled using a PWM waveform $V_{PWM\_GS1}$, or similar, that is provided by an SMPS controller (not shown for ease of illustration). It may be necessary to estimate the current $I_{SEN}$ flowing through the primary winding 314 for purposes of controlling the output power appropriately, or in order to detect and prevent saturation of the magnetic core 316 of the transformer 310.

In addition to the primary and secondary windings 314, 319, the transformer 310 also includes an auxiliary winding 312 that is magnetically coupled to the primary winding 314 and that is used for estimating the current $I_{SEN}$ flowing therein. The auxiliary winding 312 has a terminal A2 that is directly connected to a terminal W2 of the primary winding 314, wherein the combination of the terminals A2, W2 represent a common terminal. The number $N_A$ of turns of the auxiliary winding 312 are matched to the number of turns $N_P$ of the primary winding 314. Output terminals A1, W1 of the auxiliary and primary windings 312, 314 are provided to the current estimator 120, which generates a current estimate $I_{SEN\_EST}$ as described in the description accompanying FIG. 1. The primary winding 314 in the SMPS circuit 300 corresponds to the main winding 114 in the current sense circuit 100. Note that in the above and subsequent descriptions, the use of the term "output terminal" for a winding does not imply a particular current flow direction or voltage polarity, but merely implies that the terminal provides an output voltage of the winding, wherein this output voltage may be used as an input voltage to some other circuit, such as the current estimator 120.

While the description above describes estimating the current within the primary winding of a transformer in a flyback converter, it should be recognized that the techniques also apply to transformers in other topologies, and that the current could be sensed through a primary, secondary or some other winding. The techniques require that the transformer (or similar) include a main winding that may be inductively coupled to an auxiliary winding, in order to estimate the current through the main winding.

FIG. 4 illustrates a non-isolated SMPS circuit 400 that does not include a transformer per se, but which includes a winding (inductor) 114 through which current $I_{SEN}$ is to be estimated. This SMPS circuit 400 is configured as a buck converter. The buck converter 400 steps down an input voltage $V_{IN}$ to produce an output voltage $V_{OUT}$ used to power a load $R_{LOAD}$. The power transfer is controlled using a power switch $Q_1$ which, in turn, is typically controlled by a controller in order to maintain the necessary output power for the load $R_{LOAD}$.

An auxiliary winding 112 is configured to inductively couple with the inductor (main winding) 114 across the magnetic core 116, in a manner similar to that described in the current sense circuit 100. The voltage $V_{AUX}$ across the inductance $L_{AUX}$ is approximately the same as the voltage $V_1$ across the inductive component $L_1$ of the inductor (main winding) 114, i.e., $V_{AUX} \approx V_1$. This, in turn, means that $V_{SEN} \approx V_{ESR}$. The current estimator 120 measures the sense voltage $V_{SEN}$ and generates the current estimate $I_{SEN\_EST}$ in the same manner as described in relation to the current sense circuit 100 of FIG. 1.

While the SMPS circuit 400 of FIG. 4 describes a step-down buck converter, it should be appreciated that the current sense circuit 100 may be similarly incorporated into other non-isolated voltage converters having a main winding (inductor) through which current needs to be estimated. For example, a boost (step-up) converter includes an inductor through which current could be estimated using a current sense circuit 100 similar to that described above.

FIGS. 2-4 have illustrated a sampling of SMPS (voltage converters) that include electromagnetic components, such as transformer windings or inductors, through which current is estimated. These specific examples are illustrated and described for purposes of clarity, and it should be appreciated that the techniques described may be used within other SMPS topologies or in other types of electric devices.

FIG. 5 illustrates a circuit 500 corresponding to a three-phase electric motor having three motor windings 514$u$, 514$v$, 514$w$. The currents $I_U$, $I_V$, $I_W$ through each of these motor windings 514$u$, 514$v$, 514$w$ are to be estimated. This is accomplished by configuring auxiliary windings 512$u$, 512$v$, 512$w$ that are inductively coupled to the motor windings 514$u$, 514$v$, 514$w$, and which are directly attached to the motor windings 514$u$, 514$v$, 514$w$ at one end of each. Taking phase "U" as an example, the auxiliary winding 512$u$ includes an inductance that compensates for the inductive component of the motor winding 514$u$, such that a sense voltage $V_{U\_SEN}$ approximates the voltage across the resistance $R_{ESR-U}$ of the motor winding 512$u$. The current estimator 520$u$ measures the sense voltage $V_{U\_SEN}$ and generates a current estimate $I_{U\_EST}$ in the same manner as described for the current sense circuit 100 of FIG. 1. (For ease of illustration, the equivalent series resistances/impedances of the auxiliary windings 512$u$, 512$v$, 512$w$ are not shown in FIG. 5, as are other details that can be readily gleaned from the current sense circuit 100 of FIG. 1.) The currents through the other phases, e.g., phases "V" and "W," are estimated in the same manner. While the current estimators 520$u$, 520$v$, and 520$w$ are illustrated as separate circuits, it should be appreciated that in many applications, these estimators 520$u$, 520$v$, 520$w$ would be implemented within a single controller (processor and associated memory).

The current estimation techniques described above assume that the number of turns for an auxiliary winding is well-matched to the number of turns for the main winding through which current is being estimated, and that these windings are nearly perfectly coupled magnetically. This may not always be the case. The techniques also do not account for any leakage inductance of a transformer. In some applications, particularly those in which the ESR of the main winding is relatively small, it may be necessary to take these practical considerations into account and compensate for them in order to reduce inaccuracies caused by such implementation practicalities. In the following, a more detailed explanation of the inductive coupling between an auxiliary winding and an main winding will be provided, in order to better understand these problems. Subsequently, techniques for compensating for these problems are described, in order to yield even more accurate current estimates.

Figure 6:
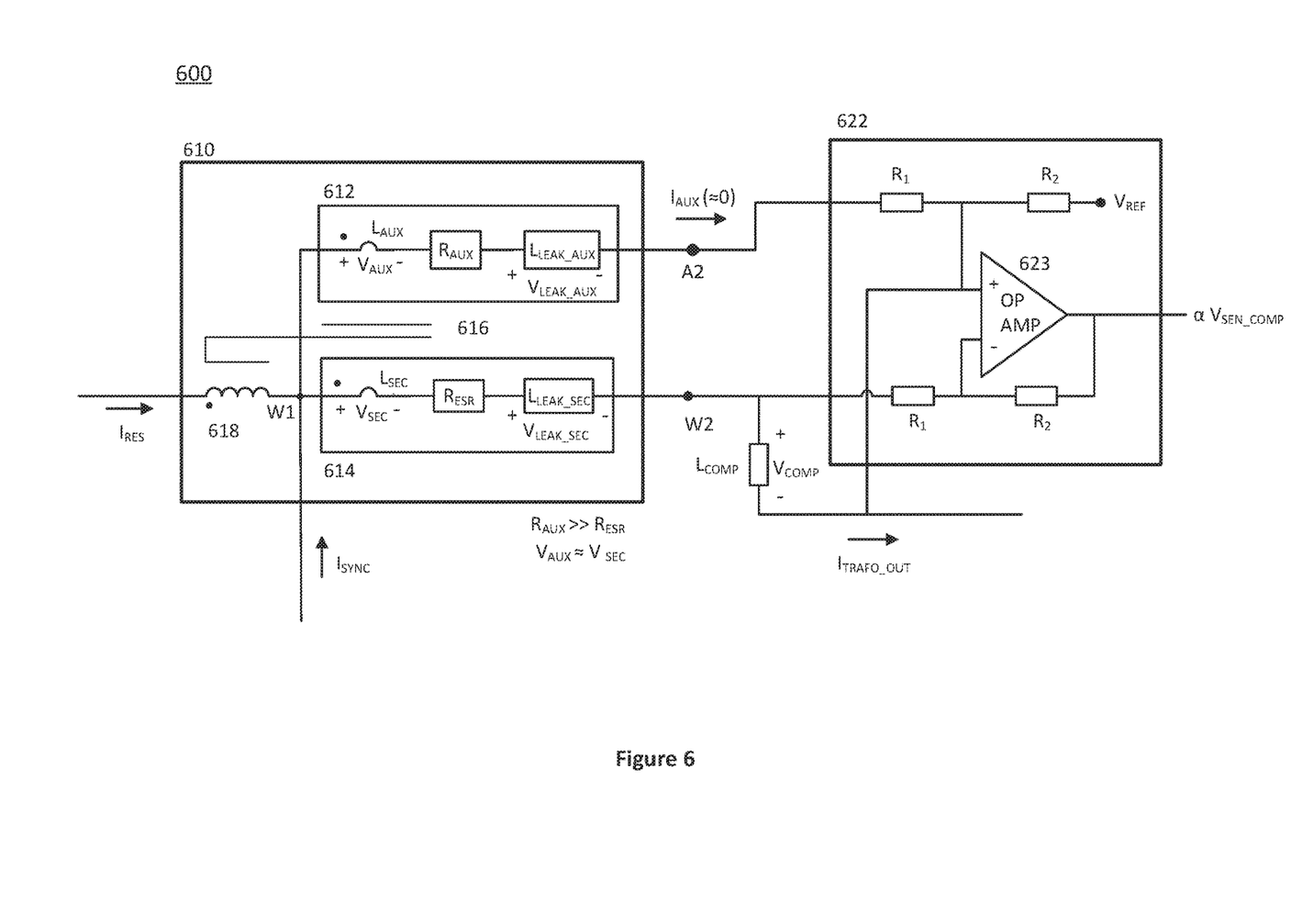
FIG. 6 illustrates a circuit diagram for a resonant SMPS including compensation circuitry that uses a compensation inductor to compensate for potential inaccuracies.

In order to provide a clear description, the problems and the compensation techniques will be described in the context of a resonant SMPS circuit similar to that illustrated in FIG. 2, a variant of which is illustrated in FIG. 6.

The description of the resonant SMPS circuit 200 of FIG. 2 presumes use of an ideal transformer in which the magnetic energy is perfectly coupled between the secondary and auxiliary windings 214, 212. In an actual transformer, this coupling is not perfect and there is some amount of magnetic flux leakage. A more accurate model takes this leakage into account by electrically modeling an actual transformer as an ideal transformer together with some leakage inductance. Such leakage inductance is considered in the resonant SMPS circuit 600 of FIG. 6, where it is modeled as an inductor $L_{LEAK\_SEC}$ in the secondary winding 614 and an inductor $L_{LEAK\_AUX}$ in the auxiliary winding 612. Note that there is no mutual inductance (magnetic coupling) between the leakage inductance and another winding.

The voltages within the resonant SMPS circuit 600 of FIG. 6 will now be considered in more detail. Because the auxiliary and secondary windings 612, 614 have a common input terminal, denoted as W1, the voltage across the output terminals A2 and W2 may be derived from the difference in the voltages across the auxiliary and secondary windings 612, 614, as follows:

$$V_{A2} = V_{W1} - V_{AUX} - I_{AUX} R_{AUX} - V_{LEAK\_AUX}, \quad (2)$$

$$V_{W2} = V_{W1} - V_{SEC} - I_{TRAFO\_OUT} R_{ESR} - V_{LEAK\_SEC}. \quad (3)$$

Hence, the voltage difference between the terminals A2 and W2 (denoted as $V_{SEN}$ in FIG. 2) is given by:

$$V_{A2} - V_{W2} = (V_{W1} - V_{AUX} - I_{AUX} R_{AUX} - V_{LEAK\_AUX}) - (V_{W1} - V_{SEC} - I_{TRAFO\_OUT} R_{ESR} - V_{LEAK\_SEC}). \quad (4)$$

With $$I_{AUX} \approx 0, \frac{dI_{AUX}}{dt} \approx 0, \text{ and } V_{LEAK\_AUX} = L_{LEAK\_AUX} \frac{dI_{AUX}}{dt} \approx 0,$$

this simplifies to:

$$V_{A2} - V_{W2} = (-V_{AUX}) - (-V_{SEC} - I_{TRAFO\_OUT} R_{ESR} - V_{LEAK\_SEC}), \quad (5)$$

$$V_{A2} - V_{W2} = (V_{SEC} - V_{AUX}) + (V_{LEAK\_SEC}) + (I_{TRAFO\_OUT} R_{ESR}). \quad (6)$$

Ideally, and as presumed in the description of the current sense circuit 100, the ($V_{SEC} - V_{AUX}$) and $V_{LEAK\_SEC}$ terms, henceforth denoted as error terms, are small enough that they may be ignored, i.e., ($V_{SEC} - V_{AUX}$) << ($I_{TRAFO\_OUT} * R_{ESR}$) and ($V_{LEAK\_SEC}$) << ($I_{TRAFO\_OUT} * R_{ESR}$). However, if the ESR of the secondary winding 614 is relatively small, as is desired and typical in a resonant SMPS such as that of FIG. 6, the $R_{ESR}$ is small and the error terms may be large enough to no longer be negligible. In order to even more accurately estimate the current $I_{TRAFO\_OUT}$, a compensation may be applied for one or both of these terms. Before describing the compensation techniques, the voltage given by equation (6) will be further explained.

The voltages across the inductive components $L_{SEC}$, $L_{AUX}$, $L_{LEAK\_SEC}$ are given by:

$$V_{SEC} = L_{SEC}\frac{dI_{TRAFO\_OUT}}{dt} + M\frac{dI_{AUX}}{dt}, \quad (7)$$

$$V_{AUX} = L_{AUX}\frac{dI_{AUX}}{dt} + M\frac{dI_{TRAFO\_OUT}}{dt}, \quad (8)$$

$$V_{LEAK\_SEC} = L_{LEAK\_SEC}\frac{dI_{TRAFO\_OUT}}{dt}. \quad (9)$$

The mutual inductance M is presumed to be symmetric between the secondary and auxiliary windings 612, 614, i.e., $M = M_{SEC,AUX} = M_{AUX,SEC}$. With $I_{AUX} \approx 0$ and $$M = M_{SEC,AUX} = M_{AUX,SEC}. \text{ With } I_{AUX} \approx 0 \text{ and } \frac{dI_{AUX}}{dt} \approx 0,$$

equations (7)-(8) simplify to:

$$V_{SEC} = L_{SEC}\frac{dI_{TRAFO\_OUT}}{dt}, \quad (10)$$

$$V_{AUX} = M\frac{dI_{TRAFO\_OUT}}{dt}. \quad (11)$$

Substituting equations (9)-(11) into equation (6) yields:

$$V_{A2} - V_{W2} = \left(L_{SEC}\frac{dI_{TRAFO_{OUT}}}{dt} - M\frac{dI_{TRAFO_{OUT}}}{dt}\right) + \quad (12)$$
$$\left(L_{LEAK\_SEC}\frac{dI_{TRAFO\_OUT}}{dt}\right) + (I_{TRAFO\_OUT}R_{ESR}),$$

$$V_{A2} - V_{W2} = \quad (13)$$
$$(L_{SEC} - M + L_{LEAK\_SEC}) * \left(\frac{dI_{TRAFO\_OUT}}{dt}\right) + (I_{TRAFO\_OUT}R_{ESR}).$$

Equation (13) shows that the error terms are proportional to the differential current flowing from the secondary winding 614. The mutual and single inductances for the secondary and auxiliary windings 614, 612 are given by:

$$M = k\sqrt{L_{SEC}L_{AUX}}, \quad (14)$$

$$A_L = \frac{\mu_0\mu_r A_e}{l_e}, \quad (15)$$

$$L = A_L * N^2, \quad (16)$$

where:
k=the coupling coefficient between the secondary and auxiliary windings 614, 612,
$\mu_0$=permeability of free space,
$\mu_r$=relative permeability of core material,
$A_e$=coil area,
$l_e$=coil length.
Because the secondary and auxiliary windings 614, 612 are wound around a common core 616 and their length is approximately the same, $A_L$ may be presumed the same for both windings 614, 612. Equation (13) may, thus, be rewritten:

$$V_{A2} - V_{W2} = \quad (17)$$
$$(N_{SEC}^2 A_L - kN_{SEC}N_{AUX}A_L + L_{LEAK\_SEC}) * \left(\frac{dI_{TRAFO\_OUT}}{dt}\right) +$$
$$(I_{TRAFO\_OUT}R_{ESR}).$$

In a first correction technique, the error term is reduced by increasing the number of turns $N_{AUX}$ in the auxiliary winding 612. The added turns must couple with the inductance $L_{SEC}$ of the secondary winding 614, i.e., the added turns must increase the $L_{AUX}$ inductance rather than the (uncoupled) leakage inductance $L_{LEAK\_AUX}$ of the auxiliary winding 612. Note that the coupling coefficient k in equation (17) can be made to approach unity, but will always be at least slightly less. The coil geometry can be altered to increase the auxiliary turns $N_{AUX}$ in order to compensate for a value of k less than one, and even to compensate for the leakage inductance $L_{LEAK\_SEC}$.

In some applications, it may be unfeasible to alter the auxiliary turns $N_{AUX}$ in order to drive the error term to zero. For example, it may not be feasible to have $N_{AUX} \neq N_{SEC}$ when using a bifilar coil. For such cases even with $N_{AUX} \approx N_{SEC}$ and $k \approx 1$, there remains an error due to the leakage inductance $L_{LEAK\_SEC}$. This may be compensated by the addition of a compensation inductor $L_{COMP}$, as shown in FIG. 6.

The voltages $V_{A2}$ and $V_{W2}$ are directly input to the differential amplifier 122 of FIG. 1. In order to compensate for the error terms, the differential voltage input to the differential amplifier should be decreased by:

$$(N_{SEC}^2 A_L - kN_{SEC}N_{AUX}A_L + L_{LEAK\_SEC}) * \left(\frac{dI_{TRAFO\_OUT}}{dt}\right) \quad (18)$$

This is accomplished in the resonant SMPS circuit 600 by using a compensation inductor $L_{COMP}$ placed across the terminal W2 and the positive input to an op amp 623, such that a compensation voltage $$V_{COMP} = L_{COMP}\left(\frac{dI_{TRAFO\_OUT}}{dt}\right)$$

is subtracted from the sense voltage ($V_{A2}-V_{W2}$) before the sense voltage is amplified by the op amp 623. The compensation inductor $L_{COMP}$ should be chosen such that:

$$L_{COMP} = (N_{SEC}^2 A_L - kN_{SEC}N_{AUX}A_L + L_{LEAK\_SEC}). \quad (19)$$

For the case where there is no mismatch between the turns $N_{SEC}$, $N_{AUX}$ and the coupling coefficient $k \approx 1$, equation (19) indicates that the compensation inductor $L_{COMP}$ should have the same inductance as that of the leakage inductance $L_{LEAK\_SEC}$ of the secondary winding 614, which may be determined during a characterization of the transformer 610. The amplified voltage, denoted as $\alpha V_{SEN\_COMP}$, may then be used to estimate the current $I_{TRAFO\_OUT}$ such that the current estimate is compensated to remove the inaccuracies caused by leakage inductance and/or a mismatch in the winding turns $N_{SEC}$, $N_{AUX}$.

The differential amplifier 622 includes an op amp 623 which is configured to amplify the voltage across terminals A2 and W2, after modifying this voltage by $V_{COMP}$. The resistors R1, R2 are chosen to provide an appropriate amplification α, as is known in the art.

Figure 7:
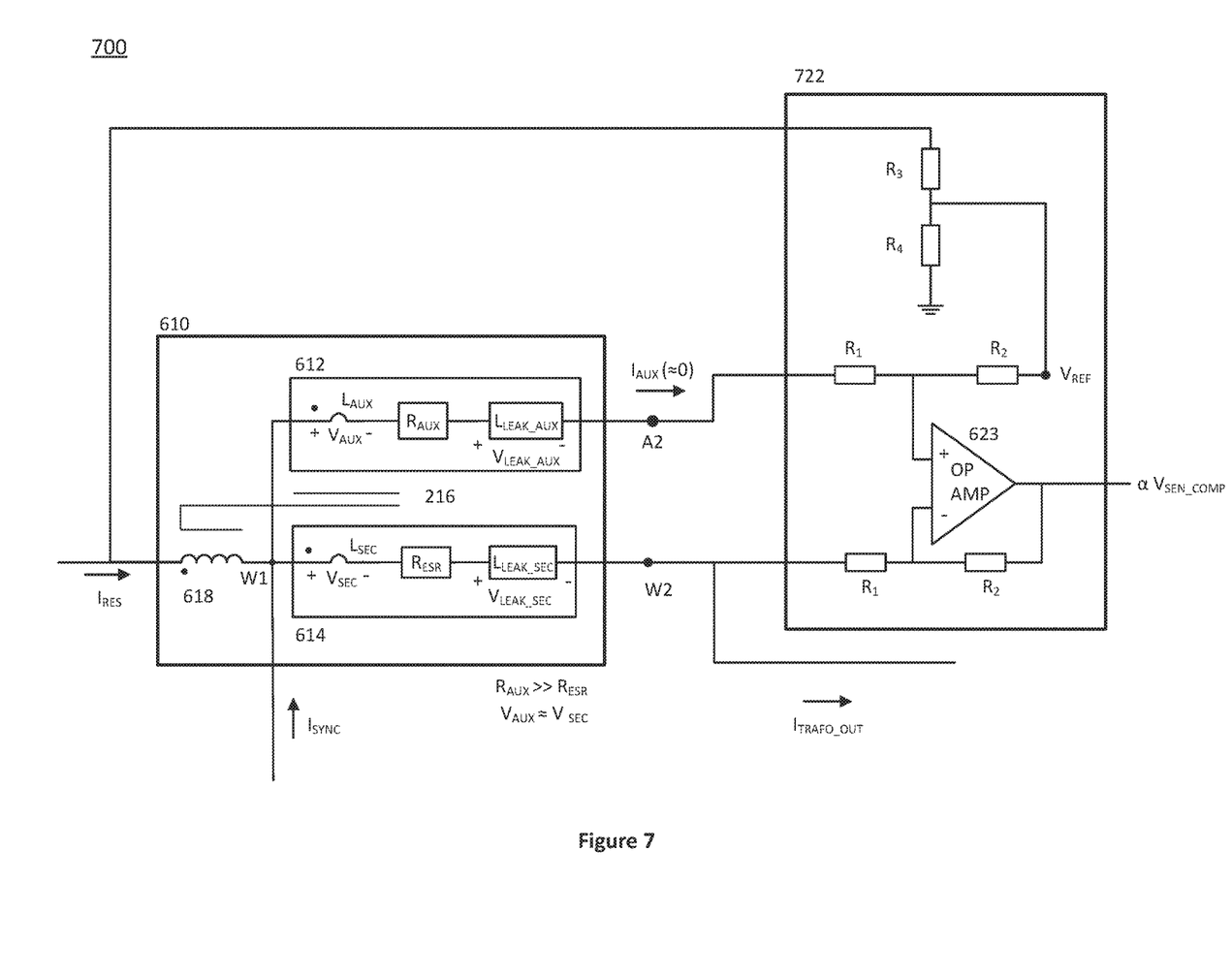
FIG. 7 illustrates a circuit diagram for a resonant SMPS including compensation circuitry in which a scaled version of a transformer input voltage is provided as a reference voltage for an amplifier used as part of a current sense circuit.

FIG. 7 illustrates a resonant SMPS circuit 700 including another technique for compensating for errors. The resonant SMPS circuit 700 is similar to that of FIG. 6, except there is no compensation inductor and the reference voltage $V_{REF}$ for the differential amplifier 722 is based upon the input voltage to the primary winding 618. More particularly, the input voltage to the primary winding 618 is coupled to a resistor divider made up of $R_3$ and $R_4$. The center tap of the resistor divider is provided as the reference voltage $V_{REF}$ to the op amp 623 circuit within the differential amplifier 722. This reference voltage serves to compensate for errors in the voltage across the winding output terminals A2, W2, which is input to the differential amplifier 722. The differential amplifier 722 outputs a scaled and compensated voltage $\alpha V_{SEN\_COMP}$, which is used by other parts of a current estimator to produce an estimate of the current $I_{TRAFO\_OUT}$ flowing through the secondary winding 614.

Figure 8:
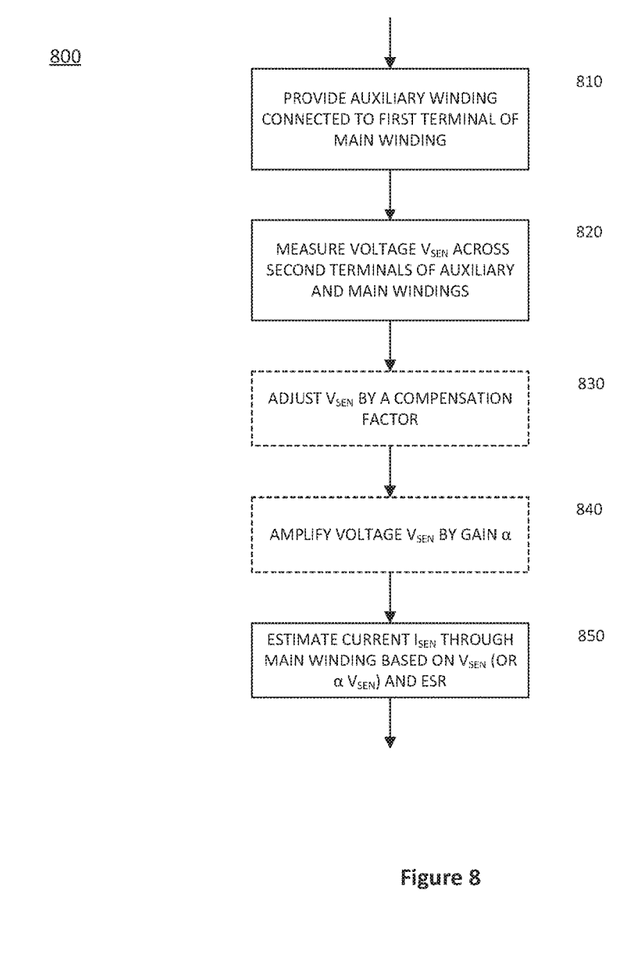
FIG. 8 illustrates a method for estimating current in a main winding, wherein the method uses an auxiliary winding to compensate for the inductance of the main winding.

FIG. 8 illustrates a method 800 for estimating current through a main winding. The method may be implemented within a current sense circuit such as that illustrated in FIG. 1. The techniques of this method 800 are similar to those described above regarding the current sense circuit 100 of FIG. 1, and the SMPS circuits and motor circuit of FIGS. 2-7.

The method begins by providing 810 an auxiliary winding configured for estimating the current through a main winding. The auxiliary winding includes a first terminal that is directly connected to a first terminal of the main winding, wherein the combination of the first terminals is termed a common terminal. The auxiliary winding is magnetically coupled to the main winding and has an inductance such that the voltage across the auxiliary winding approximates the voltage across the inductive component of the main winding.

A voltage $V_{SEN}$ between a second terminal of the auxiliary winding and a second terminal of the main winding is measured 820. In an optional step 830, the voltage $V_{SEN}$ is adjusted to compensate for inaccuracies, e.g., as caused by a mismatch in the number of turns in the auxiliary and main windings, or due to leakage inductance in a transformer. In another optional step 840, the voltage $V_{SEN}$ is amplified by a gain factor α. Such amplification may be accomplished, e.g., using a differential amplifier. In applications in which the ESR of the main winding is reasonably high, there may be no need to amplify the voltage $V_{SEN}$. However, in applications in which the ESR of the main winding is very small, e.g., as is typical in resonant voltage converters having a single secondary transformer winding, the voltage $V_{SEN}$ may need differential amplification in order to mitigate common-mode noise and to generate a voltage $\alpha V_{SEN}$ that is in a usable range for subsequent processing, e.g., by an ADC.

The current $I_{SEN}$ through the main winding is estimated based upon $V_{SEN}$ (including, possibility, a compensated or amplified version of $V_{SEN}$), and the equivalent series resistance $R_{ESR}$ of the main winding. In an exemplary embodiment, the estimated current is given by $I_{SEN\_EST}=V_{SEN}/R_{ESR}$.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A current sense circuit, comprising:
   a main winding including a common terminal and a main second terminal, and being characterized by an inductance and an equivalent series resistance (ESR);
   an auxiliary winding directly connected to the common terminal and having an auxiliary second terminal, the auxiliary winding configured to compensate for the inductance of the main winding and connected such that substantially no current flows through the auxiliary winding; and
   a current estimator comprising inputs coupled to the main second terminal and to the auxiliary second terminal, the current estimator operable to measure a voltage between the auxiliary second terminal and the main second terminal, and to estimate the current in the main winding based upon the measured voltage and the ESR of the main winding,
   wherein the current estimator presents a high input impedance to the auxiliary second terminal such that approximately no current flows through the auxiliary winding and the measured voltage is proportional to the current flowing through the main winding, and
   wherein there is no direct electrical connection between the main second terminal and the auxiliary second terminal.

2. The current sense circuit of claim 1, wherein the current estimator comprises:
   a differential amplifier configured to generate an amplified output voltage based upon the measured voltage.

3. The current sense circuit of claim 1, wherein the current estimator comprises:
   a controller operable to generate the current estimate based upon the measured voltage and the ESR of the main winding according to:

$$I_{SEN\_EST} = \frac{V_{SEN}}{R_{ESR}},$$

wherein $I_{SEN\_EST}$ is the estimated current in the main winding,
   $V_{SEN}$ is the measured voltage across the main and auxiliary second terminals, and
   $R_{ESR}$ is an estimate of the ESR of the main winding.

4. The current sense circuit of claim 1, wherein the main and auxiliary windings are parts of a bifilar coil, wherein the main and auxiliary windings are parallel to each other and have approximately equivalent lengths such that the inductance of the main winding and an inductance of the auxiliary winding are approximately equivalent.

5. The current sense circuit of claim 1, wherein the auxiliary winding is increased or decreased in length such that its inductance is matched to that of the main winding within a predetermined tolerance.

6. A switched-mode power supply (SMPS) comprising the current sense circuit of claim 1, wherein the SMPS further comprises:
an input power stage; and
a transformer comprising a primary winding coupled to the input power stage and a secondary winding coupled to an output load of the SMPS, wherein the main winding through which current is to be estimated is the primary winding or the secondary winding.

7. The SMPS of claim 6, wherein the SMPS has a resonant or semi-resonant topology, the SMPS further comprising:
a synchronous switch or a diode operable to couple a center tap of the transformer to ground,
wherein the primary winding is connected to the secondary winding at the center tap,
wherein the secondary winding is the main winding through which current flow is to be estimated.

8. The SMPS of claim 6, wherein the transformer is a flyback transformer comprising the primary winding and the secondary winding which are not electrically coupled together, and the main winding through which current is to be estimated is the primary winding or the secondary winding.

9. The SMPS of claim 6, wherein the SMPS has a buck topology and wherein the main winding through which current is to be estimated is an inductor within the SMPS.

10. The SMPS of claim 6, wherein the SMPS has a boost topology and wherein the main winding through which current s to be estimated is an inductor within the SMPS.

11. The SMPS of claim 6, wherein the current sense circuit further comprises:
a differential amplifier configured to generate an amplified output voltage based upon the measured voltage; and
a compensation inductor coupled across the main second terminal and an input to the differential amplifier, wherein the compensation inductor is configured to compensate for at least one of a leakage inductance of the transformer, and a mismatch in a number of turns of the auxiliary winding relative to a number of turns of the main winding.

12. The SMPS of claim 6, wherein the current sense circuit further comprises:
a differential amplifier configured to generate an amplified output voltage based upon the measured voltage;
wherein a scaled version of an input voltage provided by the power stage to the primary winding is provided as a reference voltage to the differential amplifier, the reference voltage being used to compensate for at least one of a leakage inductance of the transformer, and a mismatch in a number of turns of the auxiliary winding relative to a number of turns of the main winding.

13. An electric motor comprising the current sense circuit of claim 1, wherein the main winding through which current is to be estimated is a winding of the motor.

14. A method for estimating current in a main winding that includes a common terminal and a main second terminal, the method comprising:
providing an auxiliary winding directly connected to the common terminal and that is configured to compensate for an inductance of the main winding and connected such that substantially no current flows through the auxiliary winding, wherein the auxiliary winding has an auxiliary second terminal, and wherein there is no direct electrical connection between the main second terminal and the auxiliary second terminal;
measuring a voltage between the main second terminal and the auxiliary second terminal using a high-impedance sensing circuit, the high-impedance sensing circuit presenting a high input impedance to the auxiliary second terminal such that approximately no current flows through the auxiliary winding and the measured voltage is proportional to the current flowing through the main winding; and
estimating the current in the main winding based upon the measured voltage and an equivalent series resistance (ESR) of the main winding.

15. The method of claim 14, wherein the voltage between the main second terminal and the auxiliary second terminal is measured and amplified using a differential amplifier.

16. The method of claim 14, wherein the main winding is part of a switched mode power supply (SMPS) that includes a power stage and a transformer comprising a primary winding coupled to the power stage and a secondary winding coupled to an output load of the SMPS, and wherein the main winding is the primary winding or the secondary winding.

17. The method of claim 16, wherein the voltage between the main second terminal and the auxiliary second terminal is measured and amplified using a differential amplifier, the method further comprising:
compensating for at least one of a leakage inductance of the transformer and a mismatch in a number of turns of the auxiliary winding relative to a number of turns of the main winding, by providing a compensation voltage to the inputs of the differential amplifier such that the compensation voltage is summed with the measured voltage, the compensation voltage being generated across a compensation inductor attached to the main second terminal and an input of the differential amplifier.

18. The method of claim 16, wherein the voltage between the main second terminal and the auxiliary second terminal is measured and amplified using a differential amplifier, the method further comprising:
generating a scaled version of a voltage provided by the power stage to the primary winding for use as a reference voltage by the differential amplifier, the reference voltage being used to compensate for at least one of a leakage inductance of the transformer, and a mismatch in a number of turns of the auxiliary winding relative to the number of turns of the main winding.

* * * * *